United States Patent
Tseng et al.

(10) Patent No.: US 12,055,849 B2
(45) Date of Patent: Aug. 6, 2024

(54) METHOD FOR CORRECTING SEMICONDUCTOR MASK PATTERN AND SEMICONDUCTOR STRUCTURE FORMED BY APPLYING THE SAME

(71) Applicant: UNITED MICROELECTRONICS CORP., Hsinchu (TW)

(72) Inventors: Sheng-Lun Tseng, Tainan (TW); Yen-Ting Pan, New Taipei (TW); Chih-Wei Hsu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 591 days.

(21) Appl. No.: 17/363,380

(22) Filed: Jun. 30, 2021

(65) Prior Publication Data

US 2022/0365418 A1    Nov. 17, 2022

(30) Foreign Application Priority Data

May 14, 2021  (CN) .......................... 202110527032.7

(51) Int. Cl.
*G03F 1/36* (2012.01)
*G03F 7/00* (2006.01)
*H01L 21/027* (2006.01)

(52) U.S. Cl.
CPC ............ *G03F 1/36* (2013.01); *G03F 7/70441* (2013.01); *H01L 21/0274* (2013.01)

(58) Field of Classification Search
CPC ... G03F 1/36; G03F 7/70441; H01L 21/0274; H01L 22/30; H01L 21/0334

USPC ....................................................... 438/780
See application file for complete search history.

(56) References Cited

U.S. PATENT DOCUMENTS

| | | | | |
|---|---|---|---|---|
| 5,962,173 A * | 10/1999 | Leroux | ............... | G03F 7/70633 430/394 |
| 6,653,026 B2 * | 11/2003 | Pierrat | ...................... | G03F 1/29 430/5 |
| 7,913,197 B1 * | 3/2011 | Kruger | ............... | G03F 7/70475 700/121 |
| 2002/0043615 A1 * | 4/2002 | Tounai | ............... | G03F 7/70441 250/221 |
| 2004/0102945 A1 * | 5/2004 | Liu | ........................... | G03F 1/36 703/14 |
| 2007/0054201 A1 * | 3/2007 | Hung | ....................... | G03F 1/34 430/5 |
| 2007/0059609 A1 * | 3/2007 | Wu | ........................ | G02B 5/201 430/7 |

(Continued)

FOREIGN PATENT DOCUMENTS

CN       109031880 A      12/2018

*Primary Examiner* — William A Harriston
(74) *Attorney, Agent, or Firm* — WPAT, P.C

(57) ABSTRACT

A method for correcting a semiconductor mask pattern includes steps as follows: A pattern to be corrected in the semiconductor mask pattern is divided into a plurality of sub-blocks that are symmetrical to and coincide with each other. Then, an optical proximity correction (OPC) step is performed on one of the plurality of sub-blocks to obtain a modified template. At least one copy template is generated according to the modified template corresponding to the other ones of the plurality of sub-blocks. The modified template and the at least one copy template are spliced to form a correcting pattern to replace the original pattern to be corrected.

17 Claims, 14 Drawing Sheets

(56) References Cited

U.S. PATENT DOCUMENTS

| | | | | |
|---|---|---|---|---|
| 2007/0061771 | A1* | 3/2007 | Habitz | G03F 1/36 716/52 |
| 2007/0130559 | A1* | 6/2007 | Torunoglu | G06F 30/39 716/53 |
| 2007/0226674 | A1* | 9/2007 | Haffner | G03F 1/36 438/689 |
| 2008/0032204 | A1* | 2/2008 | Herold | G03F 1/36 430/30 |
| 2009/0007053 | A1* | 1/2009 | Kim | G03F 1/36 716/53 |
| 2013/0275928 | A1* | 10/2013 | Zhang | G06F 30/00 716/53 |
| 2014/0045105 | A1* | 2/2014 | Huang | H01L 21/76811 430/5 |
| 2014/0282295 | A1* | 9/2014 | Huang | H01L 21/76807 716/53 |
| 2015/0072272 | A1* | 3/2015 | Huang | G03F 1/36 430/5 |
| 2016/0033859 | A1* | 2/2016 | Sasamoto | G03F 1/38 430/5 |
| 2016/0306912 | A1* | 10/2016 | Chen | G06F 30/398 |

* cited by examiner

METHOD FOR CORRECTING SEMICONDUCTOR MASK PATTERN AND SEMICONDUCTOR STRUCTURE FORMED BY APPLYING THE SAME

This application claims the benefit of People's Republic of China application Serial No. 202110527032.7, filed May 14, 2021, the subject matter of which is incorporated herein by reference.

BACKGROUND

Technical Field

The disclosure relates to a method for fabricating a semiconductor structure and the structure formed by applying the same, and more particularly to a method for correcting a semiconductor mask pattern and a semiconductor structure formed by applying the same.

Description of Background

Photolithography is an important step and plays a pivotal role in the semiconductor manufacturing process. A typical photolithography manufacturing process includes steps as follows: Exposing and developing steps are performed projecting light passing through a recticle mask to form an exposure pattern relevant to a pattern of the recticle mask in a photoresist layer disposed on semiconductor substrate (for example, a silicon wafer). And the pattern can be transferred to the substrate by an etching step using the patterned photoresist layer as an etching mask.

However, since light may be diffracted when passing through the recticle mask, and the light passing different positions of the recticle mask may further interfere, thus the actual intensity distribution of the light projected on the photoresist layer is the result of the superposition of the diffracted light, and the exposure pattern formed on the photoresist layer may not be exactly the same as the pattern of the recticle mask. This deviation between the exposure pattern and the pattern of the recticle mask due to light diffraction and interference is referred as optical proximity effect (OPE). When the pattern critical dimension (CD) of the recticle mask is much larger than the wavelength of the projected light, the deviation of the exposure pattern and the pattern of the recticle mask is relatively insignificant. But the pattern deformation and deviation may become more and more serious, as the feature size of integrated circuits continues to shrink and entering the scale of the ultra-deep sub-micron (UDSM) technology (the critical size is between 0.13 microns or even below 0.09 microns), which may directly affect the performance of the integrated circuit and its manufacturing yield.

In order to reduce the deformation and deviation between the exposure pattern and the pattern of the recticle mask as much as possible, suppress the negative effects of the optical proximity effect, and thereby improve the manufacturing yield of integrated circuits, an optical proximity correction (OPC) technology has been widely used in the pattern design and correction of the recticle mask. The currently used OPC technology usually uses a proximity correction modeling tool to perform a simulation according to the principle of light diffraction and light interference, and adjust the designed pattern of the recticle mask, especially to adjust the pattern edge of the recticle mask. After the adjusted pattern of the recticle mask is exposed, an actual exposure pattern obtained, and the difference between each corresponding edge of the actual exposure pattern and the pattern desired to be transformed from the recticle mask can be calculated and compared with a predetermined threshold. The above process can be repeated until the difference is smaller than the predetermined threshold, so that the actual exposure pattern after exposure can be consistent with the pattern desired to be transformed from the recticle mask.

However, repeating the process of adjustment, measurement, and comparison not only requires a lot of costs in recticle mask adjusting, chip printing, measurement and equipment calibration, but also time-consuming. The efficiency of the lithography process in the semiconductor manufacturing process can be thus severely limited.

Therefore, there is a method for correcting semiconductor mask pattern and a semiconductor structure formed by applying the same to obviate the drawbacks encountered from the prior art.

SUMMARY

One aspect of the present disclosure is to provide a method for correcting a semiconductor mask pattern, wherein the method includes steps as follows: Firstly, a pattern to be corrected in the semiconductor mask pattern is divided into a plurality of sub-blocks that are symmetrical to and coincide with each other. Then, an optical proximity correction (OPC) step is performed on one of the plurality of sub-blocks to obtain a modified template. At least one copy template is generated according to the modified template corresponding to the other ones of the plurality of sub-blocks. The modified template and the at least one copy template are spliced to form a correcting pattern to replace the original pattern to be corrected.

Another aspect of the present disclosure is to provide a semiconductor structure formed by applying the aforementioned method for correcting a semiconductor mask pattern.

In accordance with the aforementioned embodiments of the present disclosure, a method for correcting a semiconductor mask pattern is disclosed, in which a pattern to be corrected that can be divided into a plurality of sub-blocks symmetrical to and coincide with each other are provided or found in the semiconductor mask pattern. Only perform an OPC step one time on one of the sub-blocks to obtain a modified template. Then, according to the number of sub-blocks, the modified template is copied to generate at least one copy template. And a combined correcting pattern is formed by splicing the modified template and the at least one copy template to replace the original pattern to be modified. Since, the entire pattern to be corrected can be corrected, by merely performing one OPC step to modify one of the sub-blocks of the pattern to be corrected, and then forming a plurality of copy templates, according to the modified templates, to replace the other sub-block that are not subjected to the OPC step, thus the cost and steps for performing the OPC technology, the reticle mask adjusting, the chip printing, the measurements and the equipment calibrations, during the pattern correction, can be significantly reduced; the correction time can be saved; and the efficiency of the lithography process for fabricating a semiconductor structure can be improved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
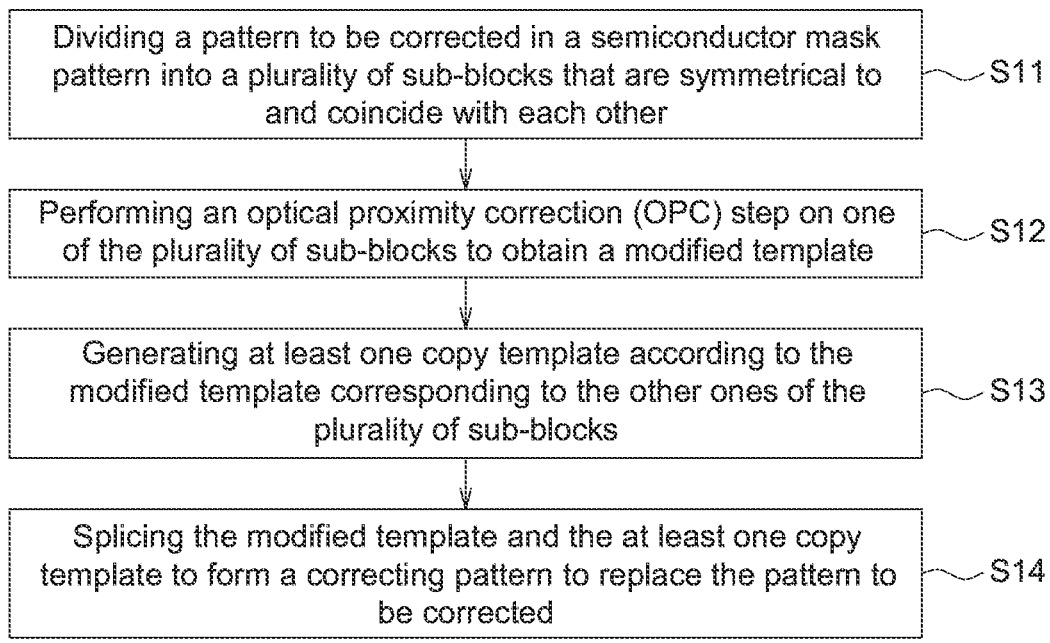
FIG. 1A is a flowchart illustrating a method for correcting a semiconductor mask pattern, according to one embodiment of the present disclosure.

The embodiments as illustrated below provide a method for correcting semiconductor mask pattern and a semiconductor structure formed by applying the same to solve the problems of the conventional OPC technology with high processing cost, time-consuming and adversely affecting lithography process efficiency. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

Figure 1B:
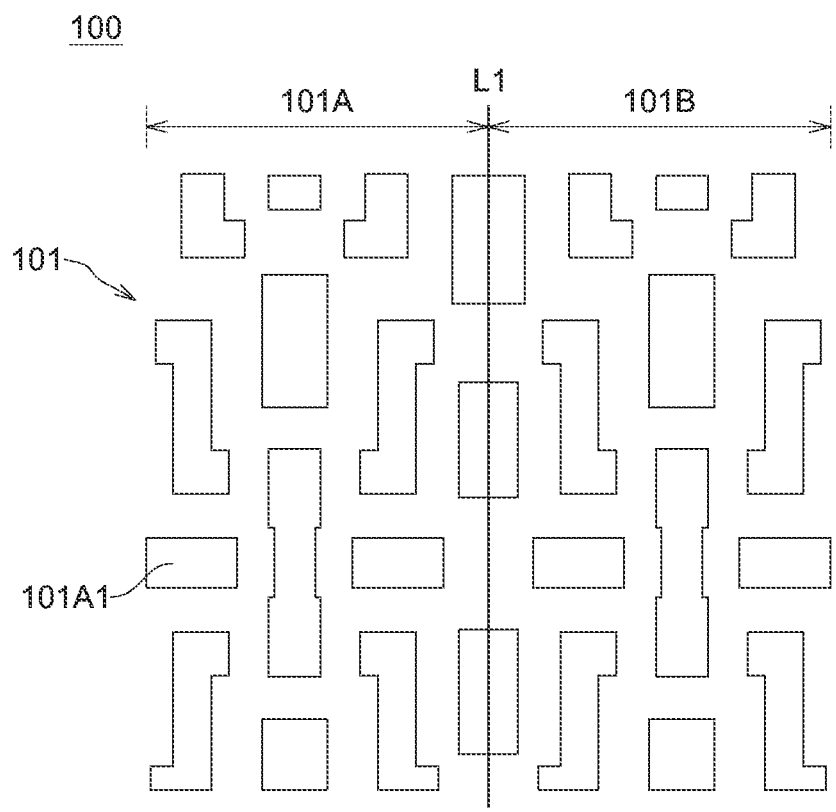
FIGS. 1B to 1D are schematic diagrams showing the change of the semiconductor mask pattern in the process for performing the method for correcting a semiconductor mask pattern as described in FIG. 1A.
Figure 1C:
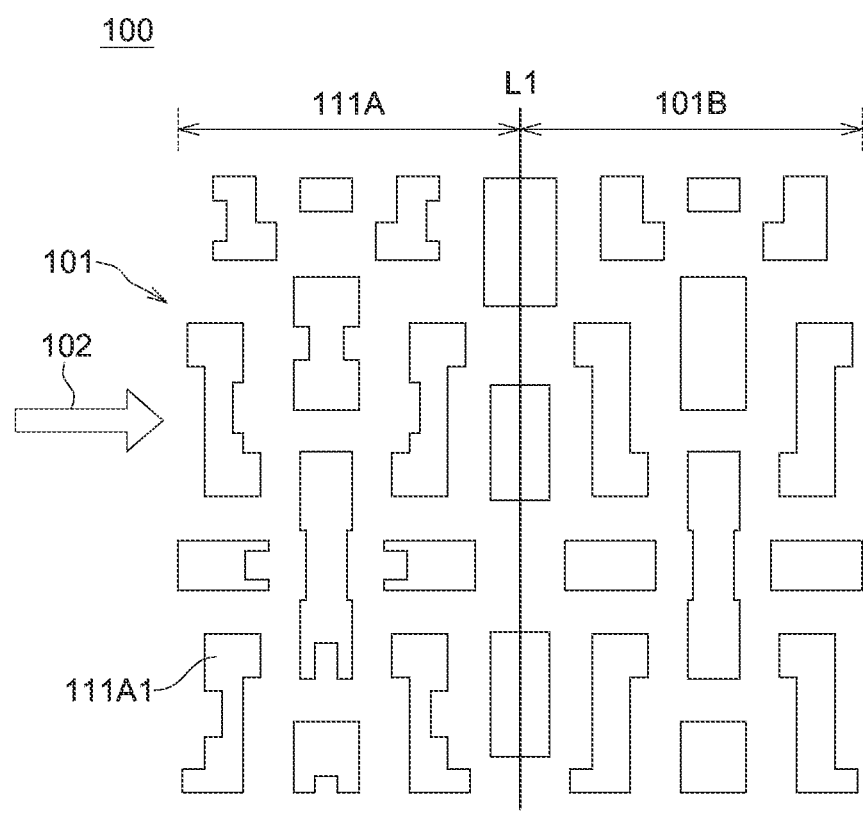
Figure 1D:
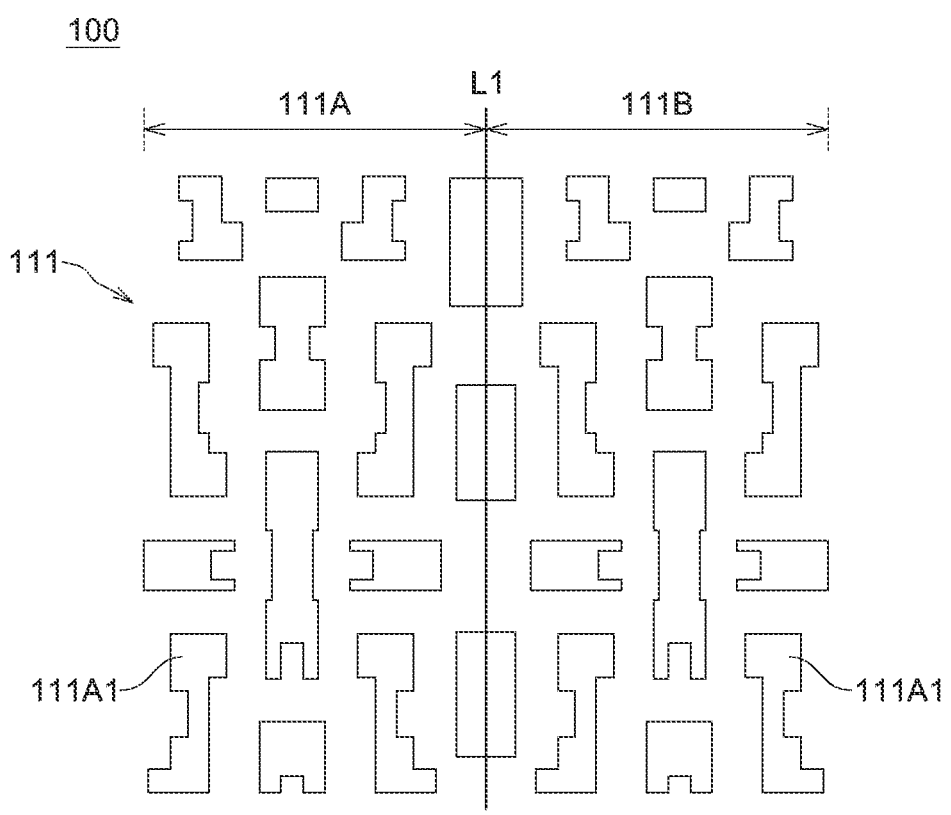

FIG. 1A is a flowchart illustrating a method for correcting a semiconductor mask pattern 100, according to one embodiment of the present disclosure. FIGS. 1B to 1D are schematic diagrams showing the change of the semiconductor mask pattern 100 in the process for performing the method for correcting the semiconductor mask pattern as described in FIG. 1A.

The method for correcting a semiconductor mask pattern includes steps as follows: Firstly, referring to step S11: a pattern to be corrected 101 in the semiconductor mask pattern 100 is divided into a plurality of sub-blocks (such as, the sub-blocks 101A and 101B) that are symmetrical to and coincide with each other. In some embodiments of the present disclosure, the pattern to be corrected 101 can be a part of the semiconductor mask pattern 100. In other embodiments, the semiconductor mask pattern 100 substantially overlaps with the pattern to be corrected 101.

In the present embodiment, the semiconductor mask pattern 100 and the pattern to be corrected 101 substantially overlap. In addition, the pattern to be corrected 101 can be an axisymmetric pattern. That is, the pattern to be corrected 101 can be divided into two symmetrical sub-blocks 101A and 101B along the symmetry axis L1. And the sub-blocks 101A and 101B include sub-block patterns 101A1 (as shown in FIG. 1B) formed by a plurality of strip-shaped or branch-shaped pattern units.

Next, referring to step S12: An optical proximity correction (OPC) step 102 is performed on one of the plurality of sub-blocks (such as, the sub-block 101A or the sub-block 101B) to obtain a modified template 111A. In some embodiments of the present disclosure, the OPC step 102 includes steps of using computer software, according to the principle of light diffraction and interference, considering parameters such as mask material, pattern size, optical proximity effect, etc., to perform an optical simulation on the sub-block pattern 101A1 in the sub-block 101A of the pattern to be corrected 101, and then adjusting the edge positions of the sub-block pattern 101A1 according to the results of the simulation.

In the present embodiment, the OPC step 102 uses the simulation model software Calibre® OPCverify that is provided by Mentor Graphics and passed the chip verification to perform an optical simulation on the sub-block pattern 101A1 in the sub-block 101A of the pattern to be corrected 101. The end points, edges and corners of the strip or branch pattern unit of the sub-block pattern 101A1 in the sub-block 101A are adjusted according to the results of the simulation based on principle of optical diffraction to form the modified template 111A as shown in FIG. 10. It is expected that the actual exposure pattern (not shown) of the modified template pattern 111A1 in the modified template 111A after exposure can be as close as possible to the sub-block pattern 101A1 in the sub-block 101A.

Subsequently, referring to step S13: At least one copy template 111B is generated according to the modified template 111A corresponding to the other ones of the plurality of sub-blocks (such as the sub-block 101B). And referring to step S14: The modified template 111A and the at least one copy template 111B are spliced to form a correcting pattern 111 to replace the original pattern to be corrected 101.

In the present embodiment, the modified template pattern 111A1 in the modified template 111A is copied to generate a copy template 111B corresponding to the sub-block 101B. And the modified template 111A and the copy template 111B are correspondingly spliced together to form the correction pattern 111 to replace the pattern to be corrected 101. The modified template 111A and the copy template 111B are mirrored and spliced along the symmetry axis L1 to form the correction pattern as shown in FIG. 1D.

Because the correction pattern 111 formed by splicing is composed of two symmetrical and overlapping modified template pattern 111A1. It is approximately the same as the combined result obtained by performing the OPC step 102 respectively to the sub-blocks 101A and 101B in the pattern to be corrected 101. In other words, using the method as disclosed by the present embodiment (as shown in FIG. 1A) to perform the semiconductor mask pattern correction can save half of the process and time consumed by the OPC step 102, in comparison with the prior art. Therefore, the cost of the recticle mask adjusting, the wafer printing, the measurement and the equipment calibration required for the OPC correction of the semiconductor mask pattern 100 can be significantly reduced; the correction time can be saved; and the efficiency of the lithography process for fabricating a semiconductor structure can be improved.

Figure 2A:
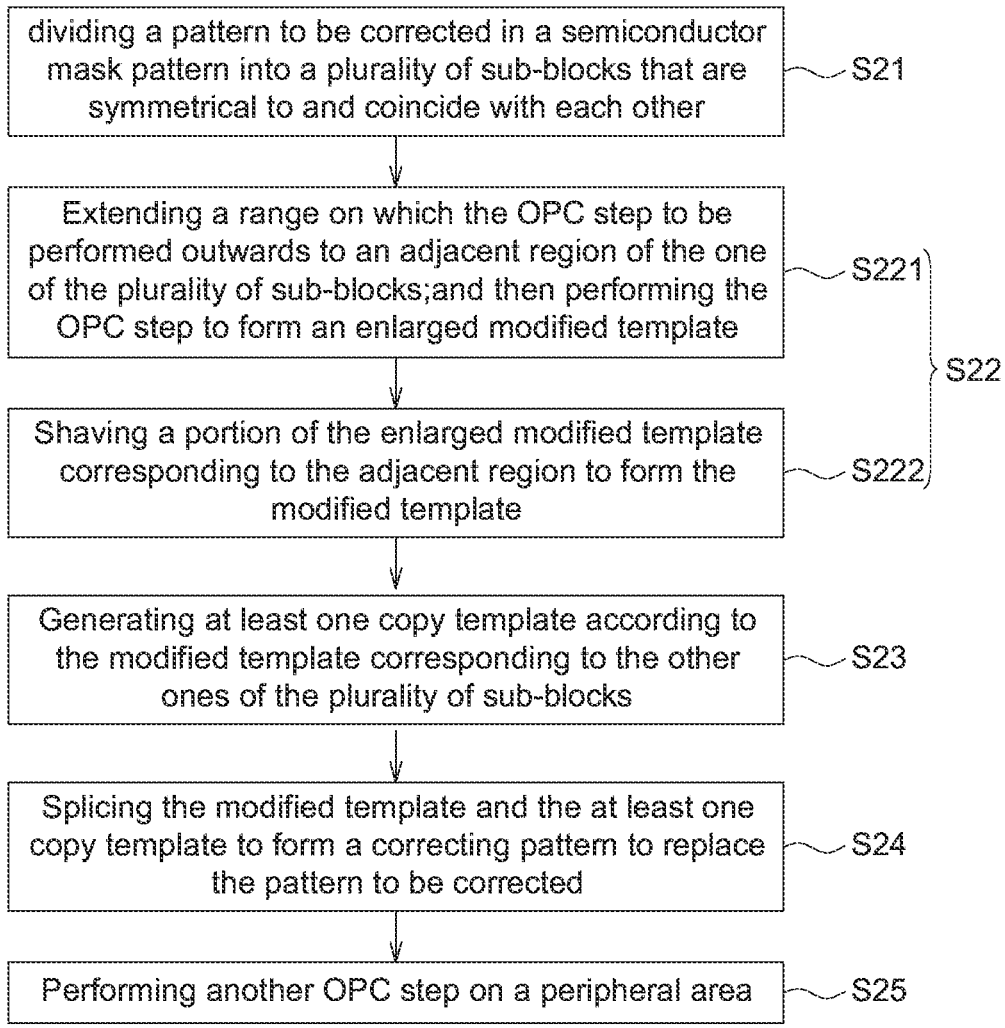
FIG. 2A is a flowchart illustrating a method for correcting a semiconductor mask pattern, according to another embodiment of the present disclosure.
Figure 2B:
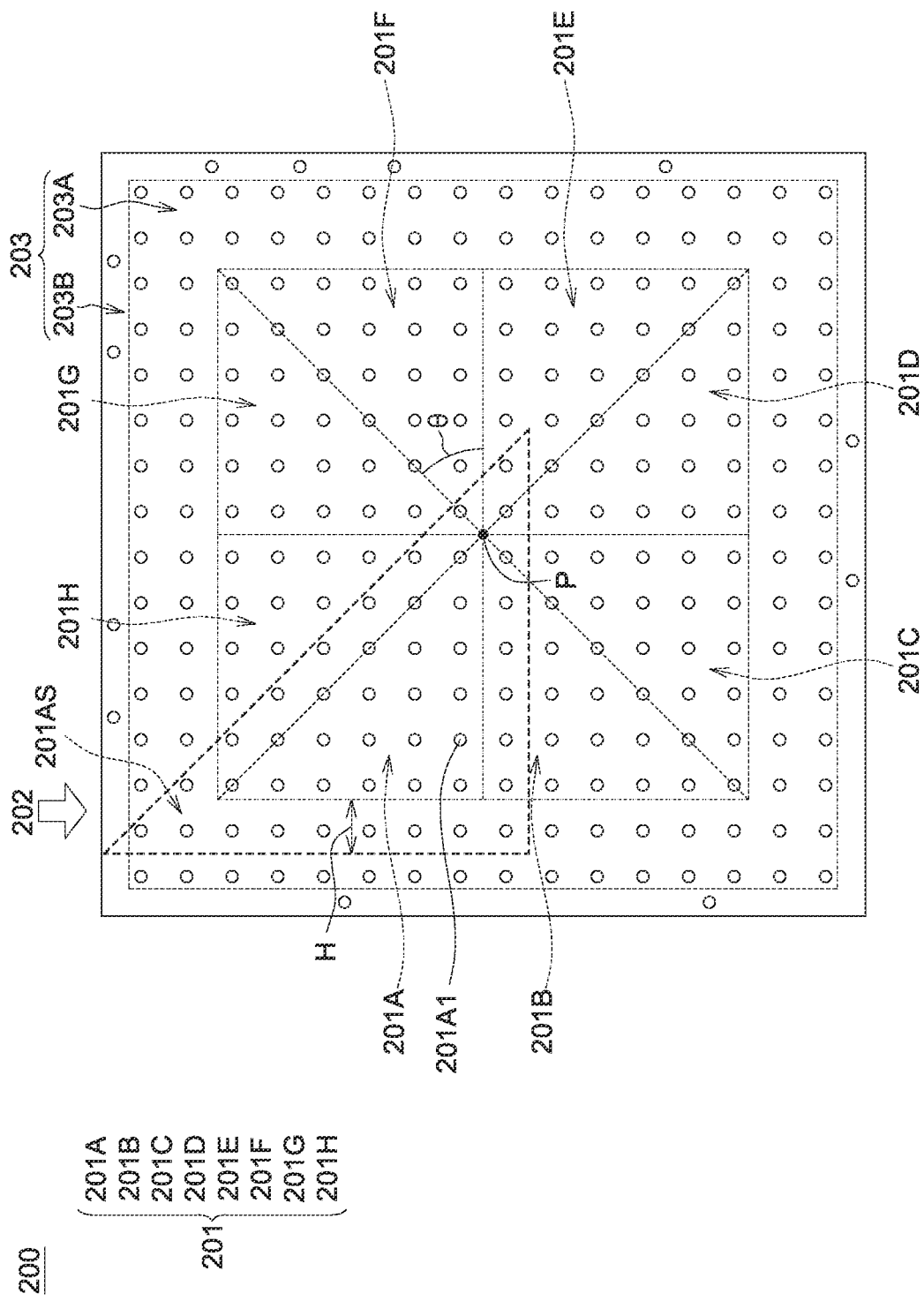
FIGS. 2B to 2D are schematic diagrams showing the change of the semiconductor mask pattern in the process for performing the method for correcting a semiconductor mask pattern as described in FIG. 2A.
Figure 2C:
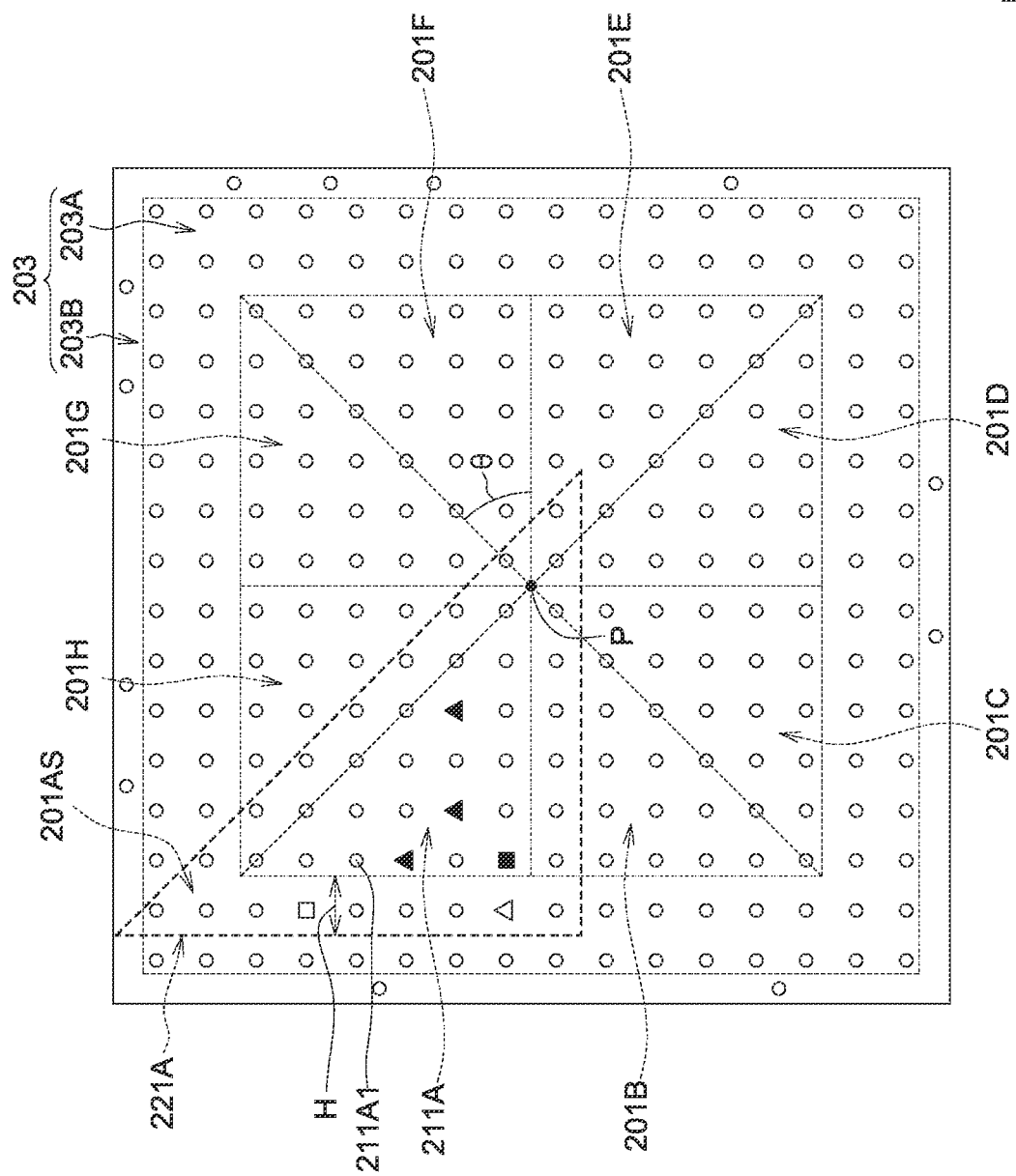
Figure 2D:
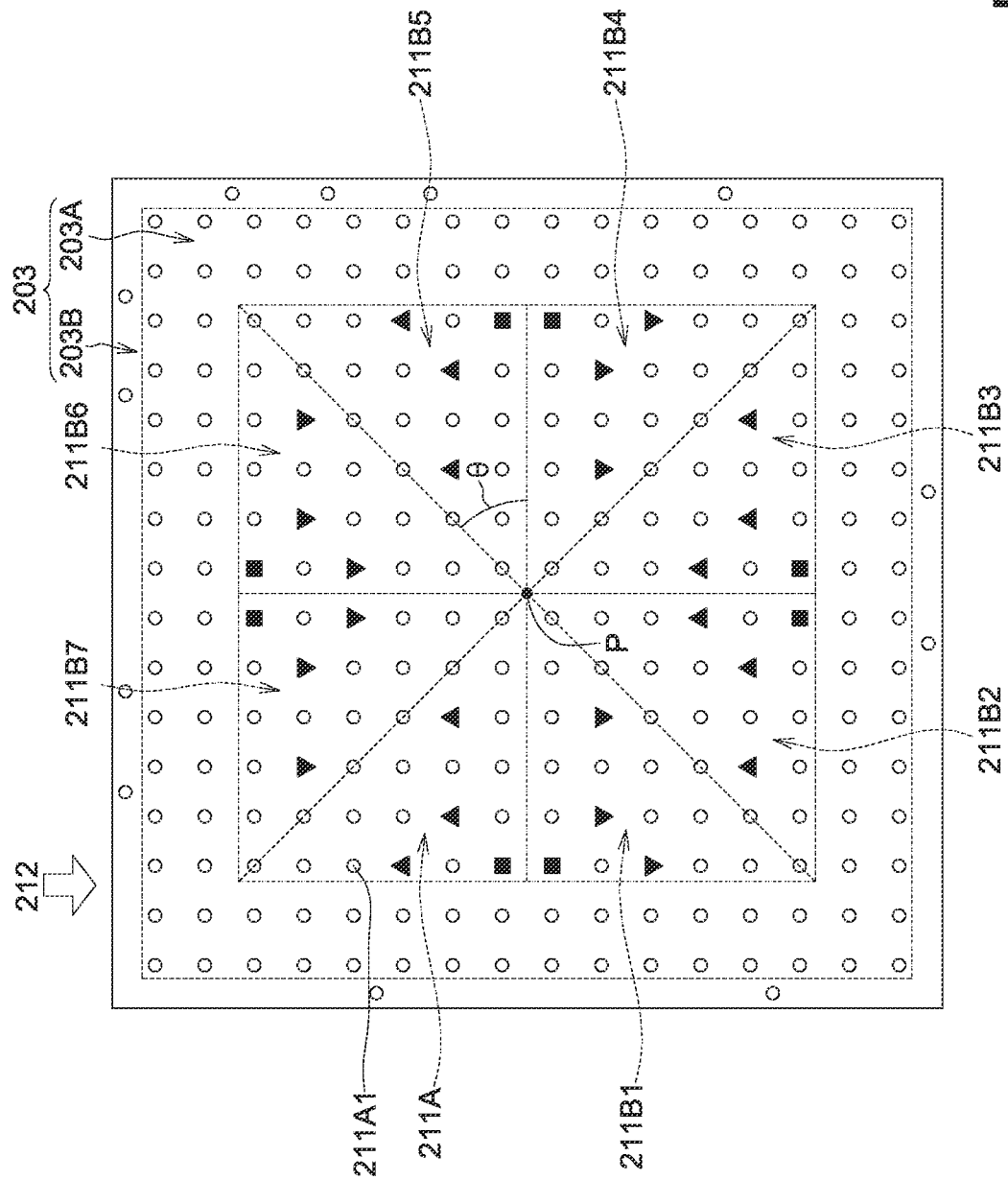

FIG. 2A is a flowchart illustrating a method for correcting a semiconductor mask pattern 200, according to another embodiment of the present disclosure. FIGS. 2B to 2D are schematic diagrams showing the change of the semiconductor mask pattern 200 in the process for performing the method for correcting a semiconductor mask pattern as described in FIG. 2A.

The method for correcting a semiconductor mask pattern as shown in FIG. 2A includes steps as follows: Firstly, referring to step S21: a pattern to be corrected 201 in the semiconductor mask pattern 200 of a semiconductor mask (not yet formed, so not shown) is divided into a plurality of sub-blocks (e.g., 8 sub-blocks 201A-201H) that are symmetrical to and coincide with each other.

In the present embodiment, the size of the semiconductor mask pattern 200 is larger than the pattern to be corrected 201. The portion of the semiconductor mask pattern 200 close to its center point can serve as the pattern to be corrected 201. And each side of the pattern to be corrected 201 to the periphery of the semiconductor mask pattern 200 includes a peripheral area 203 surrounding the pattern to be corrected 201.

As shown in FIG. 2B, the pattern to be corrected 201 can be a centrosymmetric repeating pattern. That is, the pattern to be corrected 201 has a center of symmetry P, and the pattern to be corrected 201 can be divided into 8 sub-blocks 201A-201H with a central angle θ, that can be symmetrical to and overlap with each other around the center of symmetry P (for example, θ is equal to 45°). And each sub-block 201A-201H includes a sub-block pattern 201A1 composed of a plurality of circular pattern units of the same size. However, in other embodiments, the shape, size, and number of the pattern units in the pattern to be corrected 201 may not be limited.

In some embodiments of the present disclosure, the peripheral area 203 away from the pattern to be corrected 201 has at least one pair of portions that can symmetrically overlap with each other around the center of symmetry P. For example, in this embodiment, the peripheral area 203 can be divided into a buffer area 203A adjacent to the pattern to be corrected 201 and an edge area 203B away from the pattern to be corrected 201. Wherein, the buffer area 203A, like the pattern to be corrected 201, can be divided into 8 sub-areas (not shown) with a central angle θ, that can be symmetrically overlap with each other around the center of symmetry P. The edge area 203B cannot be divided into sub-areas that can be symmetrically overlapped with each other around the center of symmetry P.

Although, the buffer area 203A and the pattern to be corrected 201 are adjacent to each other and both can be divided into the same number of symmetrical and overlapping sub-blocks, but in considering that the buffer area 203A may be affected by the optical proximity effect caused by the light diffraction and interference of the edge area 203B, when performing the subsequent optical OPC step 202, the OPC correction of the buffer area 203A and the pattern to be corrected 201 are processed separately.

Next, referring to step S22: An OPC step 202 is performed on one of the plurality of sub-blocks (such as, the sub-block 201A) to obtain a modified template 211A. In some embodiments of the present disclosure, the OPC step 202 includes steps as follows: Firstly (referring to step S221), the range of the sub-block (for example, sub-block 201A) to be subjected to the OPC step 202 is extended outwards to an adjacent region 201AS of the sub-block 201A, and the OPC step 202 is then performed (on the adjacent region 201AS and the sub-block 201A) to form an enlarged modified template 221A. Next, referring to step S222: The part of the enlarged modified template 221A corresponding to the adjacent region 201AS is shaved to form the modified template 211A.

In detail, the forming of the enlarged modified template 221A includes steps of extending the range on which the OPC step 202 to be performed outwards from the edge of the sub-block 201A for a distance H, so as to make the extended range on which the OPC step 202 to be performed includes the sub-block 201A and the adjacent region 201AS that is composed of a portion of the peripheral area 203 and a portion of other adjacent sub-blocks (for example, a portion of the sub-blocks 201B-201H). After that, the OPC step 202 is performed on the sub-block 201A and the adjacent region 201AS of the pattern to be corrected 201. By this approach, the optical proximity effect caused by the circular pattern unit in the adjacent region 201AS that may adversely affect the OPC correction of the sub-block pattern 201A1 of the sub-block 201A can be reduced during the OPC step 202.

In the present embodiment, the OPC step 202 uses the simulation model software Calibre® OPCverify that is provided by Mentor Graphics and passed the chip verification to perform an optical simulation on the adjacent region 201AS and the sub-block 201A of the pattern to be corrected 201. The end points, edges of the circular pattern unit thereof are adjusted according to the results of the simulation based on principle of optical diffraction to form the enlarged modified template 221A as shown in FIG. 2C. It is expected that the actual exposure pattern (not shown) of the enlarged modified template pattern 221A1 in the enlarged modified template 221A after exposure can be as close as possible to the sub-block pattern 201A1 in the sub-block 201A. After that, the part of the enlarged modified template 221A corresponding to the adjacent region 201AS is shaved to form the modified template 211A.

Subsequently, referring to step S23: At least one copy template (e.g., the copy templates 211B1-211B7) is generated according to the modified template 211A corresponding to (the number of) the other ones of the plurality of sub-blocks (such as the sub-blocks 201B-201H). And referring to step S24: The modified template 211A and the copy templates 211B1-211B7 are spliced to form a correcting pattern 211 to replace the original pattern to be corrected 201.

In the present embodiment, 7 copy templates 211B1-211B7 are generated according to the modified template 211A corresponding to the sub-blocks 201B-201H. And the modified template 211A and the copy templates 211B1-211B7 are spliced to form a correcting pattern 211 to replace the original pattern to be corrected 201. Among them, the modified template 211A and the copy templates 211B1-211B7 are centered on the center of symmetry P, and are mirrored and spliced with each other to form the correcting pattern 211 as shown in FIG. 2D.

Thereafter, referring to step S25: Another OPC step 212 is performed on the peripheral area 203 to complete the OPC correction of the semiconductor mask pattern 200.

Because the correction pattern 211 formed by splicing is composed of eight symmetrical and overlapping modified template pattern 211A1. It is approximately the same as the combined result obtained by performing the OPC step 202 respectively to the sub-blocks 201A-201H in the pattern to be corrected 201. In other words, using the method as disclosed by the present embodiment (as shown in FIG. 2A) to perform the semiconductor mask pattern correction can save ⅞ of the process and time consumed by the OPC step 202, in comparison with the prior art. If the number of sub-blocks in the pattern to be corrected 201 is n, and the time for each OPC step 202 is t, the correction time of (n−1)×t/n can be saved. Therefore, the cost of the recticle mask adjusting, the wafer printing, the measurement and the equipment calibration required for the OPC correction of the semiconductor mask pattern 200 can be significantly reduced; the correction time can be saved; and the efficiency of the lithography process for fabricating a semiconductor structure can be improved.

Figure 3A:
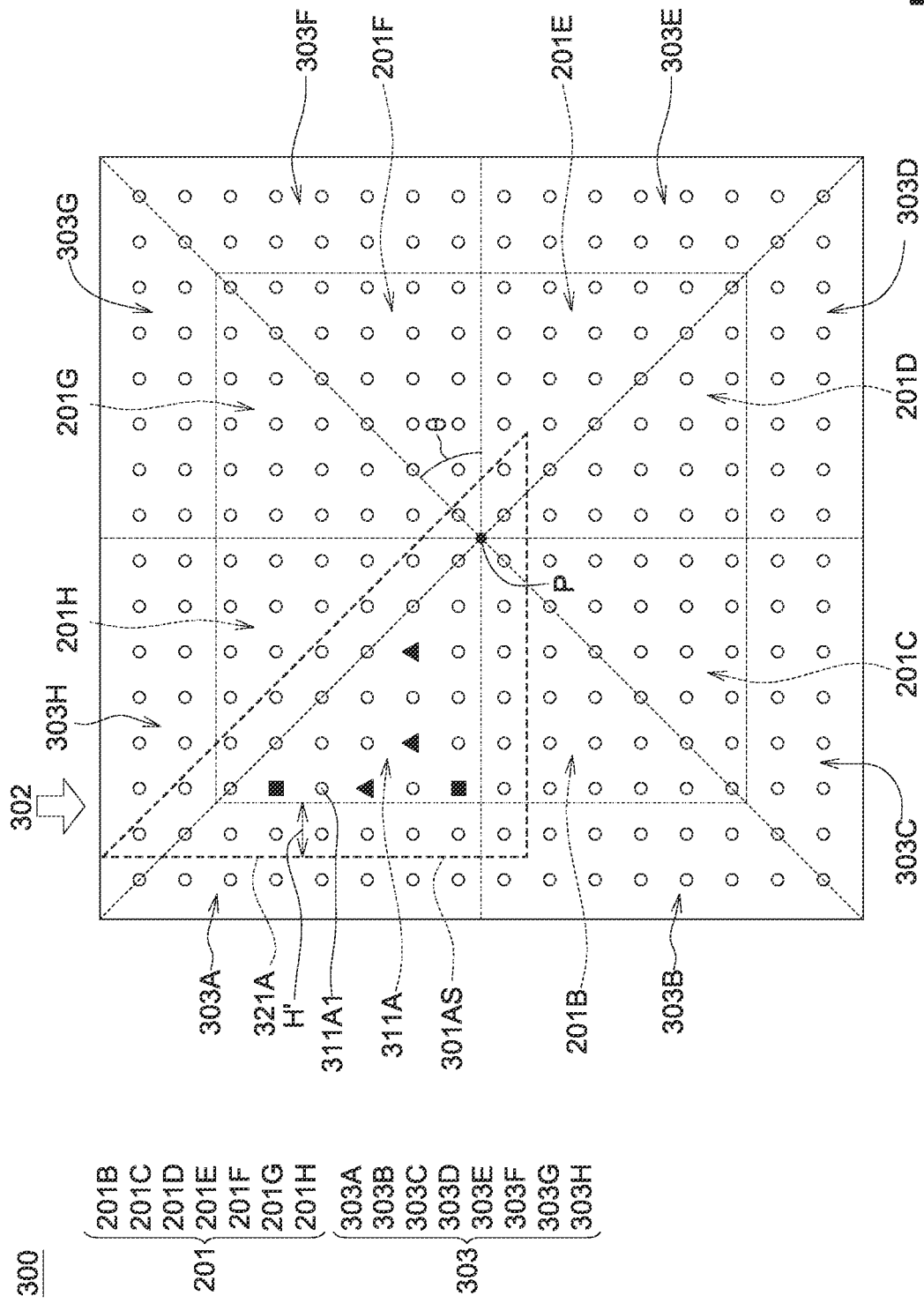
FIGS. 3A to 3C are schematic diagrams showing the change of the semiconductor mask pattern in the process for performing the method for correcting a semiconductor mask pattern as described in FIG. 2A, according to yet another embodiment of the present disclosure.
Figure 3B:
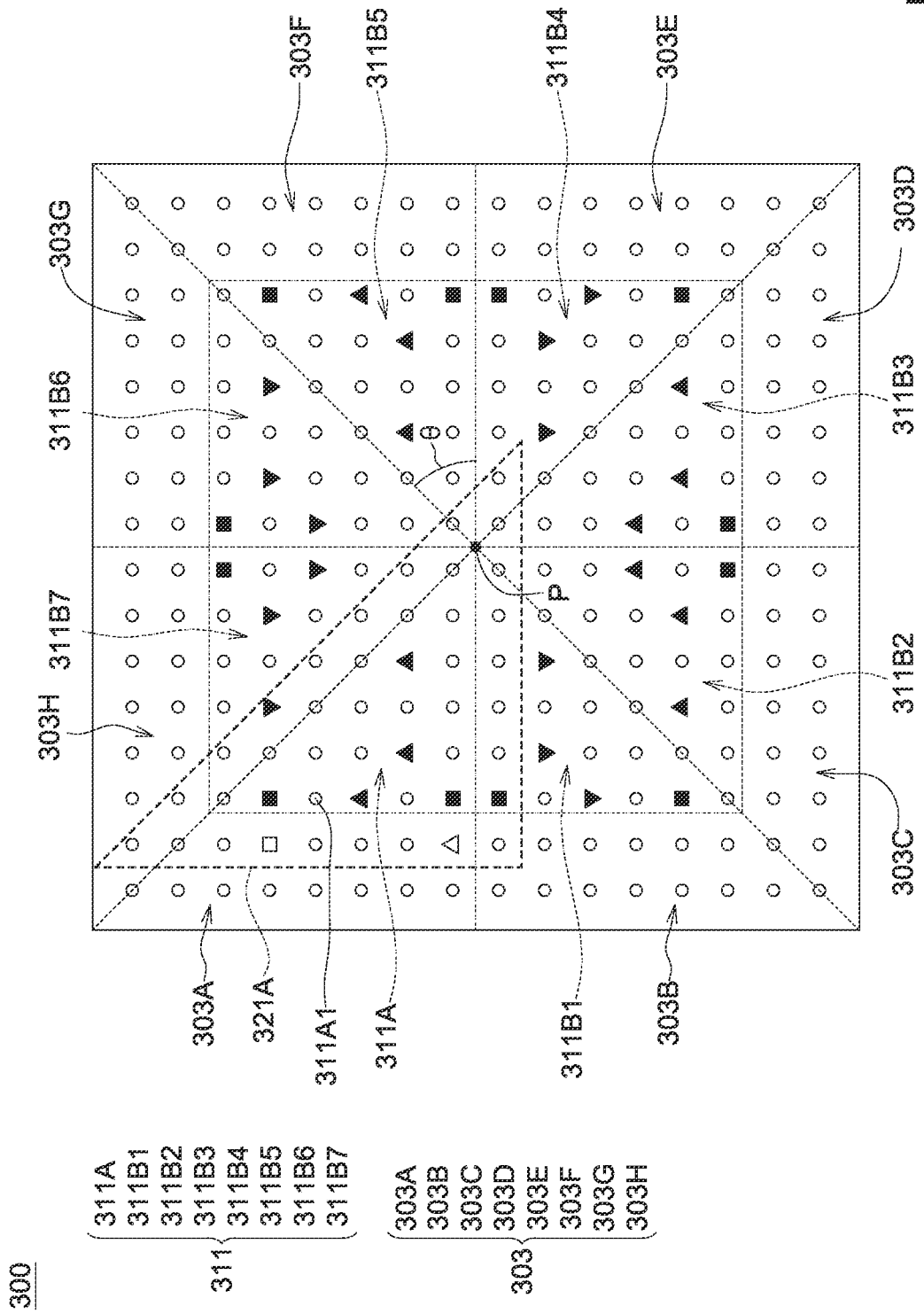
Figure 3C:
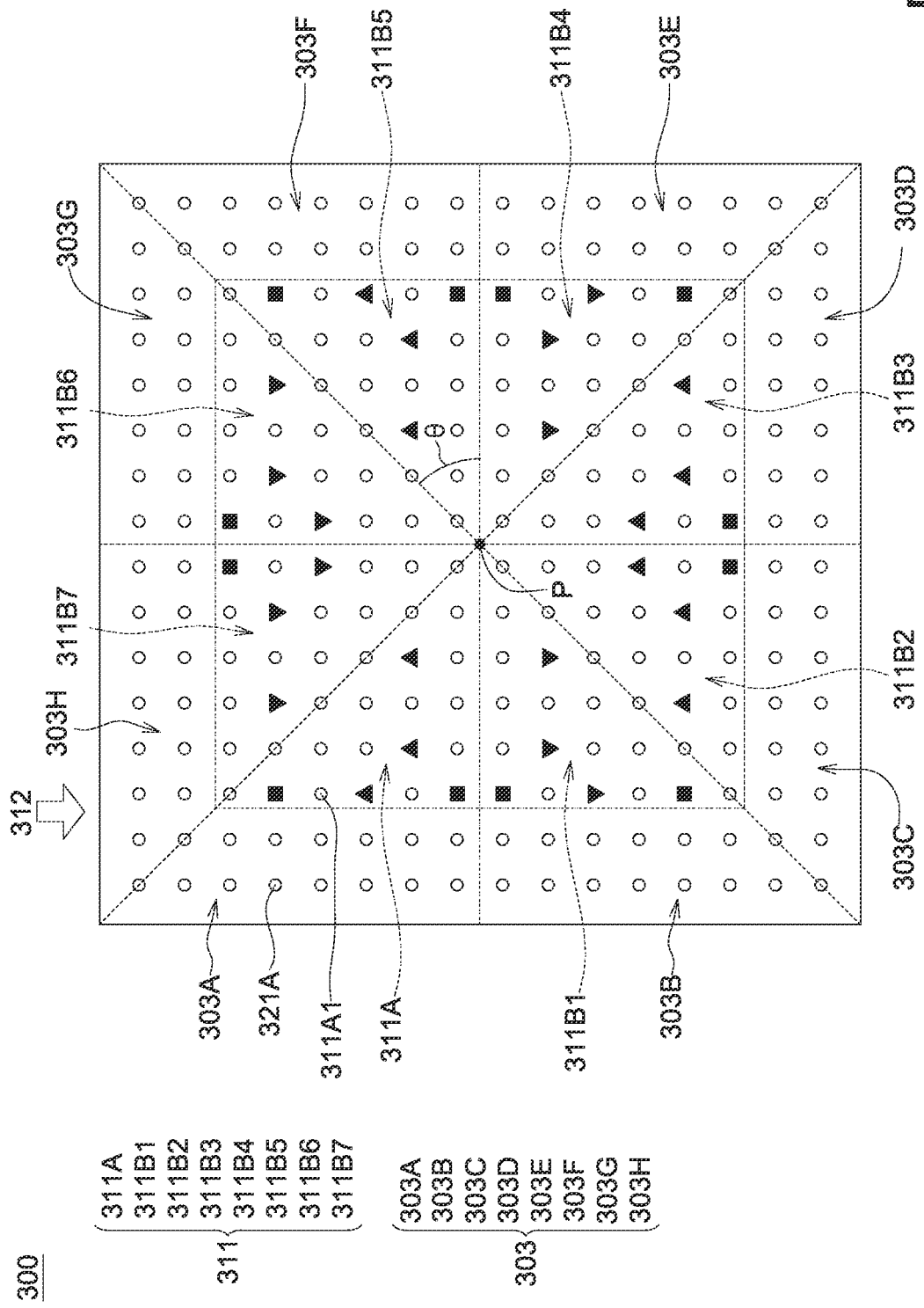

FIGS. 3A to 3C are schematic diagrams showing the change of the semiconductor mask pattern 300 in the process for performing the method for correcting a semiconductor mask pattern as described in FIG. 2A, according to yet another embodiment of the present disclosure. The correction method shown in FIGS. 3A to 3C is similar to that described in FIGS. 2B to 2D (as shown in FIG. 2A), except that there are some differences in the edge pattern of the peripheral area 303 of the semiconductor mask pattern 300, the method of forming the enlarged modified template 321A, the range on which the OPC step 302 is performed and the method of shaving the adjacent region 301AS.

Because, the steps of dividing the semiconductor mask pattern 300 into a plurality of symmetrical sub-blocks (e.g., 8 sub-blocks 201A-201H) that are symmetrical to and overlap with each other (as described in step S21) have been described in FIG. 2B, so the detail description will not be redundantly repeated here. The description of the correction method in the present embodiment can start from step S221.

In the present embodiment, the peripheral area 303, like the pattern to be corrected 301, can be divided into 8 sub-blocks 303A-303H with a central angle θ, that can be symmetrically overlap with each other around the center of symmetry P. The forming of the enlarged modified template 321A includes steps of extending the range on which the OPC step 302 to be performed outwards from the edge of the sub-block 201A for a distance H', so as to make the extended range on which the OPC step 302 to be performed includes the sub-block 201A and the adjacent region 301AS that is composed of a portion of the edge pattern of the peripheral area 303 (e.g., a portion of the sub-blocks 303A, 303B, and 303H)) and a portion of the other adjacent sub-blocks (e.g., a portion of the sub-blocks 201B-201H).

After that, the OPC step 302 is performed on the sub-block 201A and the adjacent region 301AS of the pattern to be corrected 201 to form an enlarged modified template 321A. By this approach, the optical proximity effect caused by the circular pattern unit in the adjacent region 301AS that may adversely affect the OPC correction of the sub-block pattern 201A1 of the sub-block 201A (see in FIG. 3B) can be reduced during the OPC step 302. It is expected that the actual exposure pattern (not shown) of the enlarged modified template pattern 321A1 in the enlarged modified template 321A after exposure can be as close as possible to the sub-block pattern 201A1 in the sub-block 201A (see in FIG. 2B).

After the portion of the enlarged modified template 321A corresponding to the adjacent region 301AS is shaved to form the modified template 311A (referring to step S222), at least one copy template (e.g., the copy templates 311B1-311B7) can be generated according to the modified template 311A corresponds to the other ones of the plurality of symmetric sub-blocks (such as, the sub-blocks 201B-201H) (referring to step S23). The modified template 311A and these copy templates 311B1-311B7 are spliced together to form a correcting pattern 311 as shown in FIG. 3B to replace the original pattern to be corrected 201 (referring to step S24).

Thereafter, referring to step S25: Another OPC step 312 is performed on the peripheral area 303 to complete the OPC correction of the semiconductor mask pattern 300 (as shown in FIG. 3C). Similarly, ⅞ of the process and time consumed by the OPC step 302 can be saved, in comparison with the prior art; the cost of the recticle mask adjusting, the wafer printing, the measurement and the equipment calibration required for the OPC correction of the semiconductor mask pattern 300 can be significantly reduced; the correction time can be saved; and the efficiency of the lithography process for fabricating a semiconductor structure can be improved.

Figure 4A:
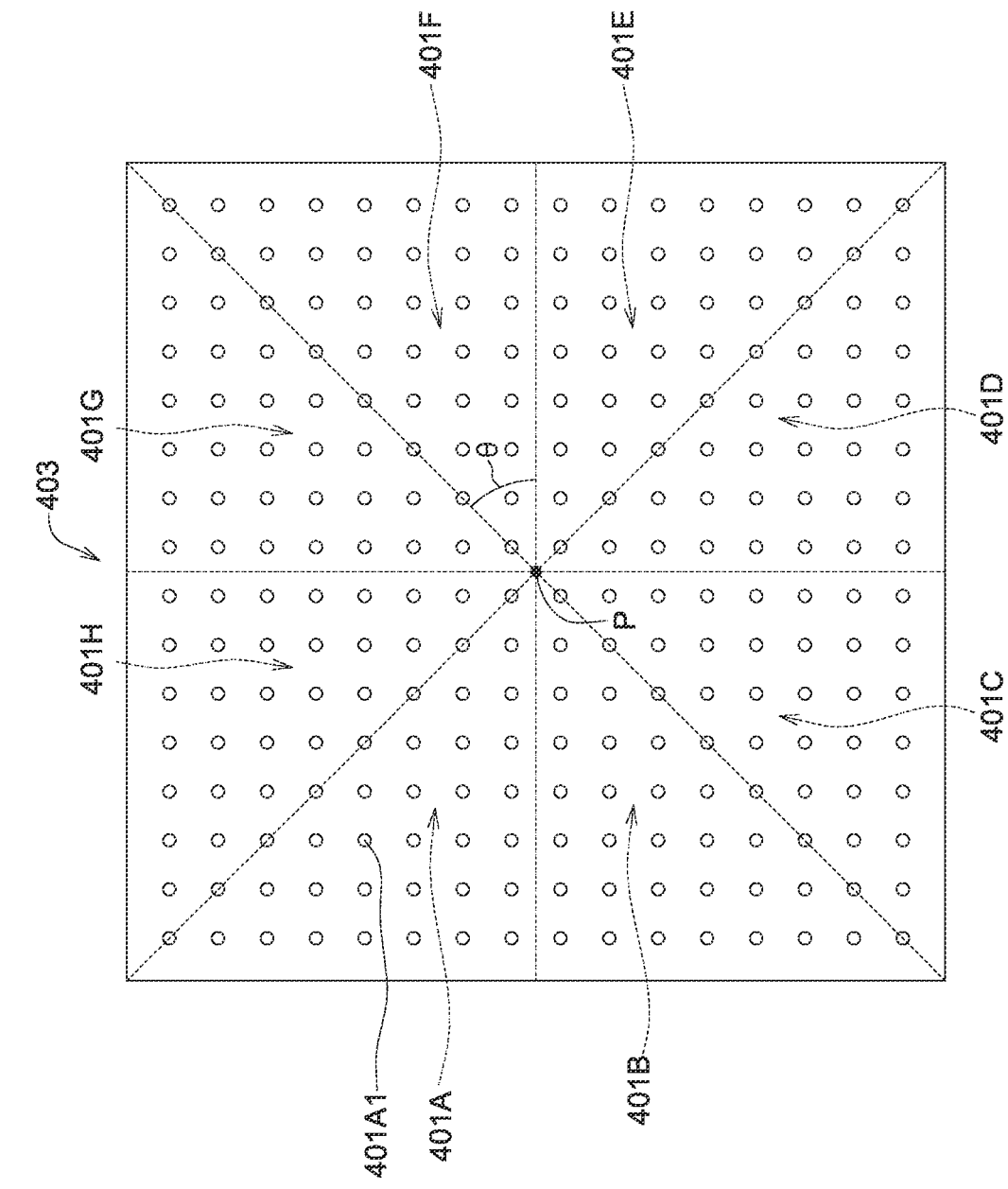
FIGS. 4A to 4C are schematic diagrams showing the change of the semiconductor mask pattern in the process for performing the method for correcting a semiconductor mask pattern as described in FIG. 2A, according to further another embodiment of the present disclosure.
Figure 4B:
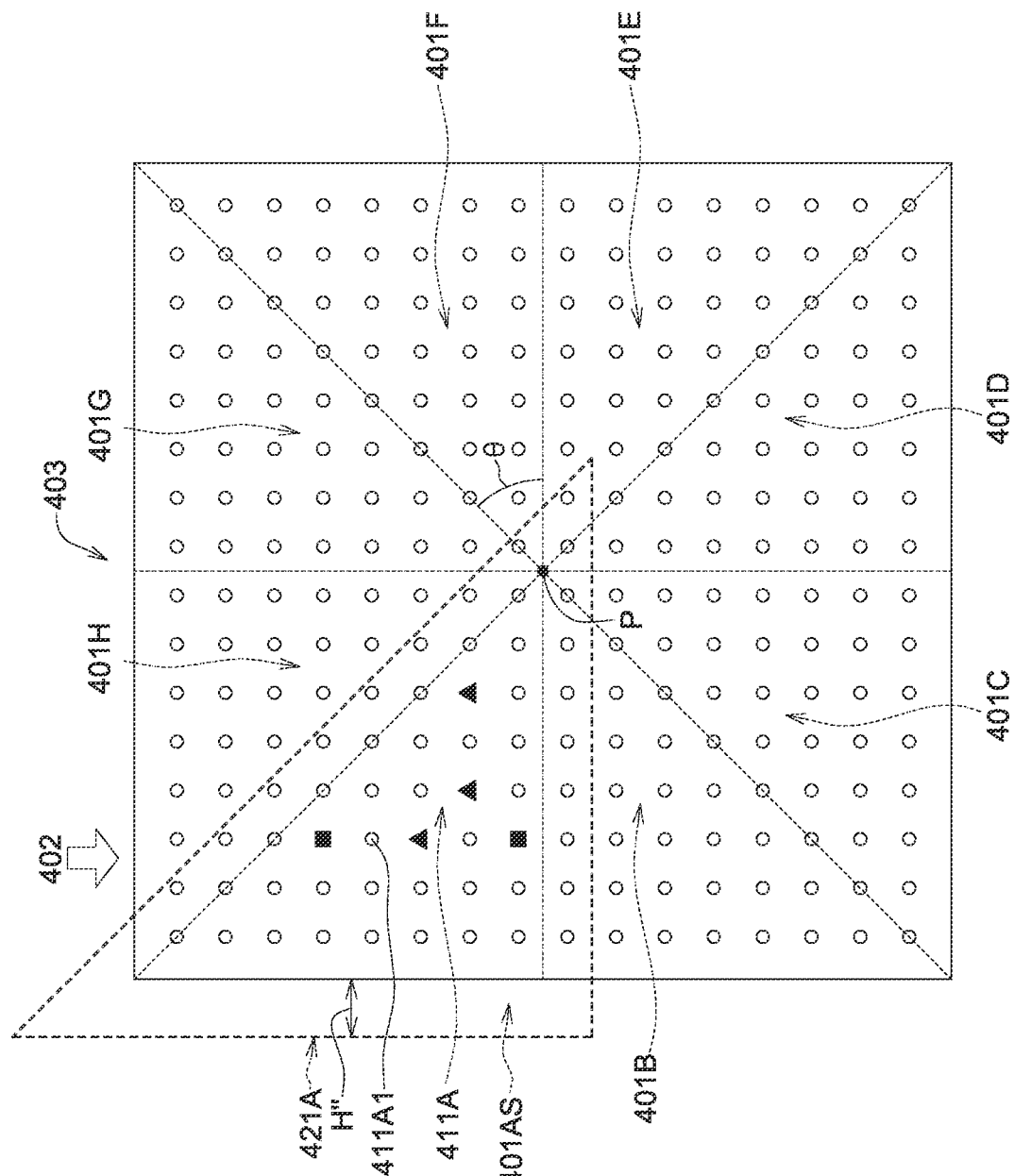
Figure 4C:
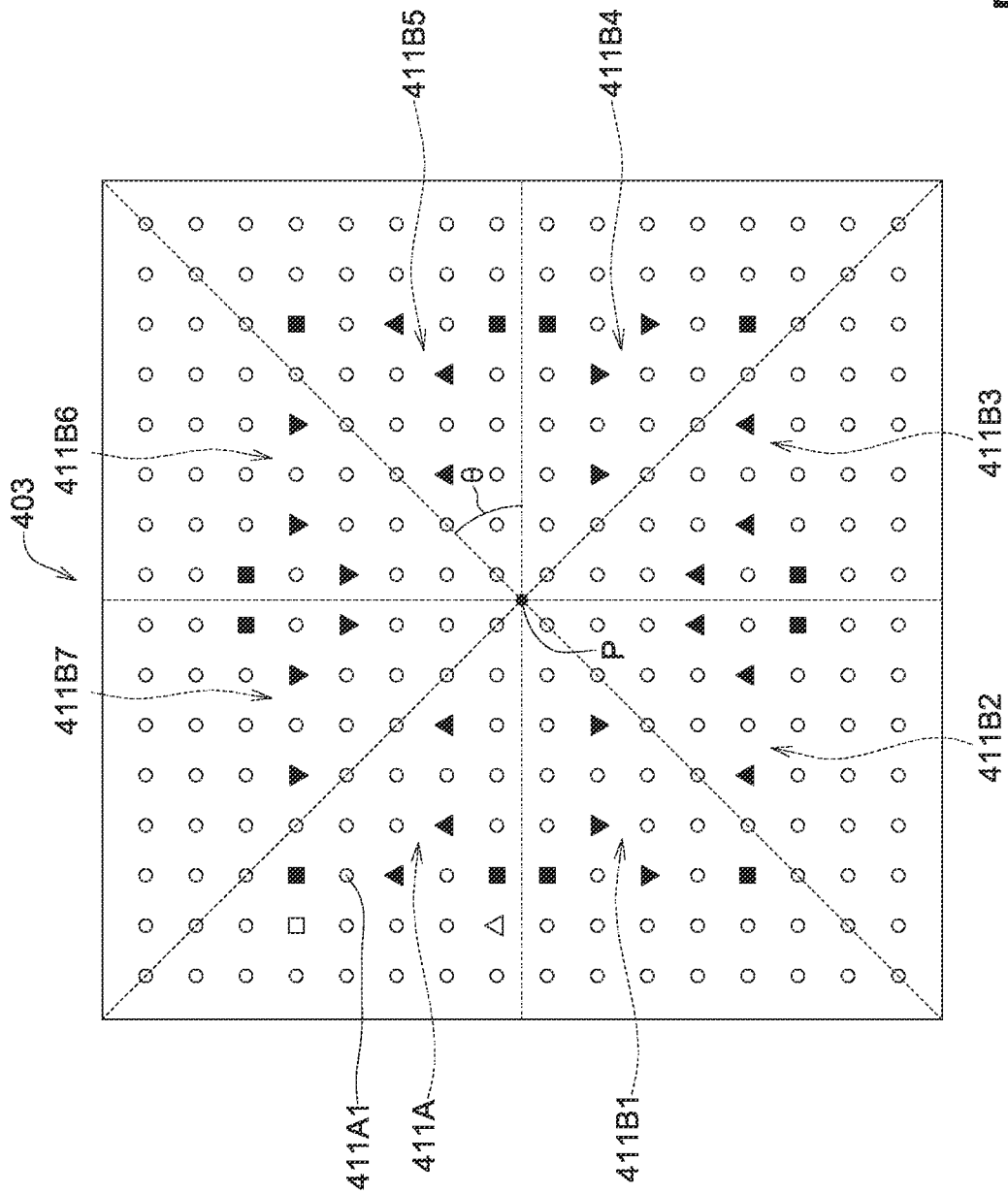

FIGS. 4A to 4C are schematic diagrams showing the change of the semiconductor mask pattern 400 in the process for performing the method for correcting a semiconductor mask pattern as described in FIG. 2A, according to further another embodiment of the present disclosure. The correction method shown in FIGS. 4A to 4C is similar to that described in FIGS. 2B to 2D (as shown in FIG. 2A), expect the facts that the peripheral area 403 of the semiconductor mask pattern 400 does not have any patterns, as well as the differences in the method of forming the enlarged modified template 421A, the range on which the OPC step 402 is performed and the method of shaving the adjacent region 401AS.

In the present embodiment, as shown in FIG. 4A, the semiconductor mask pattern 400 can be divided into 8 sub-blocks (e.g., the sub-blocks 401A-401H) with a central angle θ, that can be symmetrical to and overlap with each other around the center of symmetry P (referring to step S21). Since step S21 has been described in FIG. 2B, thus the detail description will not be redundantly repeated here. The description of the correction method in the present embodiment can start from step S221.

The forming of the enlarged modified template 421A includes steps of extending the range on which the OPC step 402 to be performed outwards from the edge of the sub-block 401A for a distance H", so as to make the extended range on which the OPC step 402 to be performed includes the sub-block 401A and the adjacent region 401AS that is composed of portions of the other adjacent sub-blocks (e.g., a portion of the sub-blocks 401B-401H) and a portion the peripheral area 403 without any edge pattern.

After that, the OPC step 402 is performed on the sub-block 401A and the adjacent region 401AS of the pattern to be corrected 401 to form an enlarged modified template 421A. By this approach, the optical proximity effect caused by the circular pattern unit in the adjacent region 401AS that may adversely affect the OPC correction of the sub-block pattern 401A1 of the sub-block 401A (see in FIG. 4A) can be reduced during the OPC step 402. It is expected that the actual exposure pattern (not shown) of the enlarged modified template pattern 421A1 in the enlarged modified template 421A after exposure can be as close as possible to the sub-block pattern 401A1 in the sub-block 401A (see in FIG. 4A).

After the portion of the enlarged modified template 421A corresponding to the portion the peripheral area 403 is shaved to form the modified template 411A (referring to step S222), at least one copy template (e.g., the copy templates 411B1-411B7) can be generated according to the modified template 411A corresponds to the other ones of the plurality of symmetric sub-blocks (such as, the sub-blocks 401B-401H) (referring to step S23). The modified template 411A and these copy templates 411B1-411B7 are spliced together to form a correcting pattern 411 as shown in FIG. 4C to replace the original pattern to be corrected 401 (referring to step S24). Since the peripheral area 403 has no edge pattern, the OPC correction can be accomplished.

In some embodiments, if there are still other patterns disposed on the outer side of the peripheral region 403 that may lead optical proximity effect on the correcting pattern 411 in the subsequent manufacturing process. Other OPC steps (not shown) may be performed separately for these other patterns outside the peripheral area 403.

Figure 5:
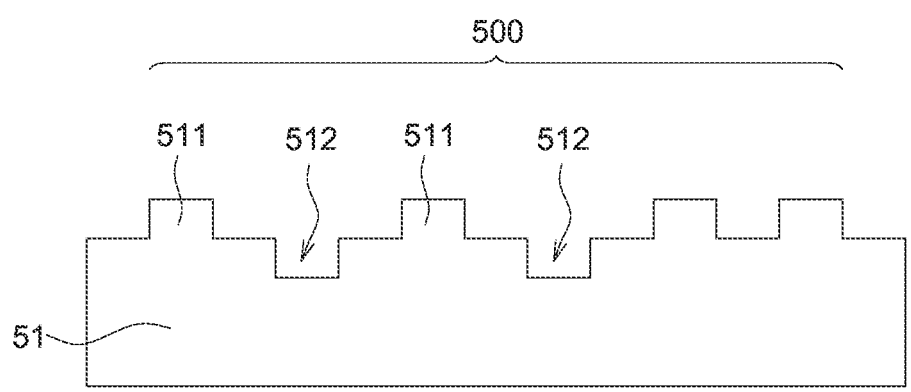
FIG. 5 is a cross-sectional view illustrating a semiconductor structure formed by applying the method for correcting a semiconductor mask pattern as described in FIGS. 2A to 2D.

FIG. 5 is a cross-sectional view illustrating a semiconductor structure 50 formed by applying the method for correcting a semiconductor mask pattern as described in FIGS. 2A to 2D. In the present embodiment, the semiconductor structure 50 includes a transparent substrate 51 and a flat optics 500 including a plurality of columnar protrusions 511, a plurality of depressions 512, or a combination thereof, that is formed by transferring the optically corrected semiconductor mask pattern 200 to a transparent substrate surface 51a of the transparent substrate 51. However, it should be appreciated that the application of the method for correcting a semiconductor mask pattern as described in FIGS. 2A to 2D is not limited to this regard, it can be applied to any semiconductor structure formed by or in a photomask lithography manufacturing process.

In accordance with the aforementioned embodiments of the present disclosure, a method for correcting a semiconductor mask pattern is disclosed, in which a pattern to be corrected that can be divided into a plurality of sub-blocks symmetrical to and coincide with each other are provided or found in the semiconductor mask pattern. Only perform an OPC step one time on one of the sub-blocks to obtain a modified template. Then, according to the number of sub-blocks, the modified template is copied to generate at least one copy template. And a combined correcting pattern is formed by splicing the modified template and the at least one copy template to replace the original pattern to be modified. Since, the entire pattern to be corrected can be corrected, by merely performing one OPC step to modify one of the sub-blocks of the pattern to be corrected, and then forming a plurality of copy templates, according to the modified templates, to replace the other sub-block that are not subjected to the OPC step, thus the cost and steps for performing the OPC technology, the recticle mask adjusting, the chip printing, the measurements and the equipment calibrations, during the pattern correction, can be significantly reduced; the correction time can be saved; and the efficiency of the lithography process for fabricating a semiconductor structure can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for correcting a semiconductor mask pattern, comprising:
   dividing a pattern to be corrected in the semiconductor mask pattern into a plurality of sub-blocks that are symmetrical to and coincide with each other;
   performing an optical proximity correction (OPC) step on one of the plurality of sub-blocks to obtain a modified template generating at least one copy template according to the modified template corresponding to the other ones of the plurality of sub-blocks; and
   splicing the modified template and the at least one copy template to form a correcting pattern to replace the pattern to be corrected.

2. The method according to claim 1, wherein the pattern to be corrected is an axisymmetric pattern or a centrosymmetric repeating pattern.

3. The method according to claim 1, wherein the step of performing the optical OPC step to obtain the modified template comprises:
   extending a range on which the OPC step to be performed outwards to an adjacent region of the one of the plurality of sub-blocks;
   performing the OPC step to form an enlarged modified template; and
   shaving a portion of the enlarged modified template corresponding to the adjacent region to form the modified template.

4. The method according to claim 1, further comprising performing another OPC step on a portion of the semiconductor mask pattern other than the pattern to be corrected.

5. The method according to claim 4, wherein the another OPC step is performed on a peripheral area away from the pattern to be corrected.

6. The method according to claim 5, wherein a portion of the peripheral area can be divided into a plurality of sub-areas symmetrically connected with each other.

7. The method according to claim 5, wherein none portion of the peripheral area can be divided into a plurality of sub-areas symmetrically connected with each other.

8. The method according to claim 1, wherein the pattern to be corrected has a center of symmetry; and the step of dividing the pattern to be corrected into the plurality of sub-blocks comprises dividing the pattern to be corrected with a central angle to make the plurality of sub-blocks can be symmetrical to and connected with each other around the center of symmetry.

9. A semiconductor structure formed by applying a method for correcting a semiconductor mask pattern, wherein the method comprising:
   dividing a pattern to be corrected in the semiconductor mask pattern into a plurality of sub-blocks that are symmetrical to and coincide with each other;
   performing an optical proximity correction (OPC) step on one of the plurality of sub-blocks to obtain a modified template;
   generating at least one copy template according to the modified template corresponding to the other ones of the plurality of sub-blocks; and
   splicing the modified template and the at least one copy template to form a correcting pattern to replace the pattern to be corrected.

10. The semiconductor structure according to claim 9, comprising:
    a transparent substrate; and
    a flat optics, having a plurality of columnar protrusions, a plurality of depressions or a combination thereof formed on a surface of the transparent substrate.

11. The semiconductor structure according to claim 9, wherein the pattern to be corrected is an axisymmetric pattern or a centrosymmetric repeating pattern.

12. The semiconductor structure according to claim 9, wherein the step of performing the optical OPC step to obtain the modified template comprises:
- extending a range on which the OPC step to be performed outwards to an adjacent region of the one of the plurality of sub-blocks;
- performing the OPC step to form an enlarged modified template; and
- shaving a portion of the enlarged modified template corresponding to the adjacent region to form the modified template.

13. The semiconductor structure method according to claim 9, wherein the method further comprises performing another OPC step on a portion of the semiconductor mask pattern other than the pattern to be corrected.

14. The semiconductor structure according to claim 13, wherein the another OPC step is performed on a peripheral area away from the pattern to be corrected.

15. The semiconductor structure according to claim 14, wherein a portion of the peripheral area can be divided into a plurality of sub-areas symmetrically connected with each other.

16. The semiconductor structure according to claim 14, wherein none portion of the peripheral area can be divided into a plurality of sub-areas symmetrically connected with each other.

17. The semiconductor structure according to claim 9, wherein the pattern to be corrected has a center of symmetry; and the step of dividing the pattern to be corrected into the plurality of sub-blocks comprises dividing the pattern to be corrected with a central angle to make the plurality of sub-blocks can be symmetrical to and connected with each other around the center of symmetry.

* * * * *